United States Patent [19]

Yoder

[11] 4,344,980
[45] Aug. 17, 1982

[54] SUPERIOR OHMIC CONTACTS TO III-V SEMICONDUCTOR BY VIRTUE OF DOUBLE DONOR IMPURITY

[75] Inventor: Max N. Yoder, Falls Church, Va.

[73] Assignee: The United States of America as represented by the Secretary of the Navy, Washington, D.C.

[21] Appl. No.: 247,423

[22] Filed: Mar. 25, 1981

[51] Int. Cl.³ .................. H01L 21/22; H01L 21/265
[52] U.S. Cl. ...................................... 427/38; 427/85; 427/88; 427/89
[58] Field of Search ................. 427/85, 38, 89, 88; 148/1.5, 188

[56] References Cited

U.S. PATENT DOCUMENTS 4,188,710 2/1980 Davey et al. .................. 427/88
4,267,014 5/1981 Davey et al. .................. 427/85

OTHER PUBLICATIONS

Anderson et al., J. Appl. Phys. 49 (5) May 1978, pp. 2998-3000.
Shahriery et al., Diffused Ge Ohmic Contact for N-Type GaAs, (Abstract for talk present at GaAs IC Symposium, TRW Inc., Redendo Beach, Calif. 11/6/80.
Yoder, Complexes and Their Effects on III-V Compounds (Paper presented at Semi-Insulating III-V Materials Conf. at U. of Nottingham, Eng. Apr. 14-16, 1980.

Primary Examiner—Ralph S. Kendall
Attorney, Agent, or Firm—R. F. Beers; L. A. Marsh

[57] ABSTRACT

A method for fabricating superior ohmic contacts in a III-V semiconductor wafer by virtue of double donor (or double acceptor) impurity complex formation. A typical III-V, e.g., GaAs, semiconductor device is fabricated by depositing a thin $Si_3N_4$ layer and then regions are opened, by photoresist methods, upon which ohmic contacts are to be made. New resist is applied over the wafer and the ohmic contact regions are again opened. Si ions are now implanted to form the active channel and the drain and source regions (in an FET device). The resist layer is removed, a layer of Ge is laid down and a layer of Se over the Ge. The Ge layer is coated with a layer of $SiO_2$, $Si_3N_4$ or a mixture of both, and annealed, causing the Ge and Se to diffuse rapidly into the Si ion implant region. The $SiO_2$, $Si_3N_4$ and excess surface Ge and Se is now removed. Metallization of the electrode areas, preferably with reliable refractory metals, is effected, producing ohmic tunneling contacts over the Ge/Se diffused regions and rectifying, non-ohmic, Schottky barrier contacts over the selected remainder of the Si-implanted region.

15 Claims, 4 Drawing Figures

SUPERIOR OHMIC CONTACTS TO III-V SEMICONDUCTOR BY VIRTUE OF DOUBLE DONOR IMPURITY

BACKGROUND OF THE INVENTION

This invention relates to the fabrication of semiconductor devices and especially to the improvement of ohmic contacts in group III-V semiconductor materials.

It has been a problem to provide satisfactory ohmic contacts in III-V type semiconductor materials, such as semiinsulating (S.I.) GaAs. When heavily implanted with Si, for example, self-compensating Si-Si complexes are frequently formed which are electrically neutral, thereby preventing formation of good ohmic contacts.

SUMMARY OF THE INVENTION

An object of this invention is to break up electrically neutral, or inactive, donor or acceptor ion complexes in III-V semiconductor substrates and substitute electrically active complexes in their places so that good ohmic contacts can be formed therewith.

Another object is to improve ohmic contacts in group III-V semiconductor compounds, such as GaAs.

The present invention is a method to dope group III-V compounds semiconductors to degeneracy such that tunnelling (nonalloyed) ohmic contacts of extremely reliable refractory metals can be made. The method employs use of a chalcogen material (in the case of donors) from column VI of the periodic table of elements to (1) enhance the diffusion of column IV materials into III-V materials by preventing the formation of covalently bonded IV—IV complexes on the surface which are too large to in-diffuse, and (2) to form IV-VI complexes within the III-V material which act as donors on their respective cation (Ga) and anion (As) lattice sites within the III-V crystal (i.e., double-sided doping effect) and which, once formed, become too large to further diffuse, thus providing extremely reliable and stable donor pairs. Diffusion into the selected region of the extremely high concentration (e.g., $>8\times 10^{18}/cm^3$) of donors is further aided by the selective implantation of silicon. The diffusion effect can be further enhanced if this implant is done while the III-V substrate is held at a temperature of 77 degrees K. If the cryogenic implant is performed, anneal/activation of the implant should be at about 580 degrees C. for about 24 hours versus the conventional anneal of 850 degrees C. for 30 minutes.

DETAILED DESCRIPTION OF THE INVENTION

Figure 1A:
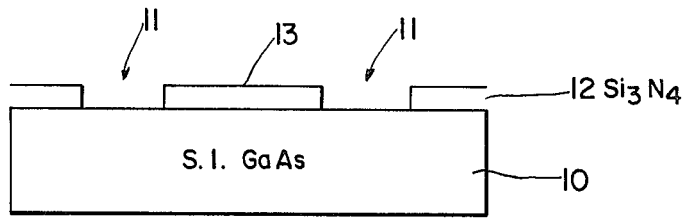
FIGS. 1A-D show the various steps in the process of fabricating improved ohmic contacts for III-V type semiconductor materials.
Figure 1B:
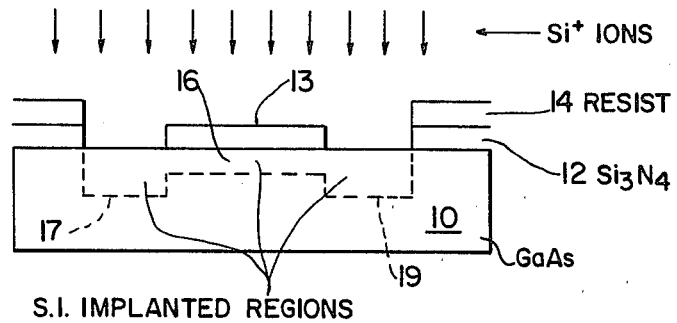

As may be seen in FIG. 1A, a III-V type semiconductor wafer 10 is selected as a substrate for fabricating a semiconductor device. The following description will relate specifically to a semi-insulating (S.I.) GaAs substrate 10, since the description is easier in terms of a specific III-V compound, and to a FET semiconductor device.

In step 1, a thin layer 12 of $Si_3N_4$ is laid down on the surface of the substrate. Using conventional photoresist techniques, areas 11 are opened in the $Si_3N_4$ layer; these areas are the regions upon which ohmic-contact electrodes are later to be placed. New photo resist is applied over the top of the device and then removed from the regions 11 which will comprise the ohmic contact region and the active channel region (under region 13 of the $Si_3N_4$ layer).

In step 2, $Si^+$ ions are beamed onto the top of the device at the energy level necessary to create the optimum depth of the electrically active channel (e.g., 1200 Å for a power FET) and at a fluence level necessary to activate the appropriate impurity donor density (e.g., $2\times 10^{17}/cm^3$ for a power FET). Note that the Si ions are not energetic enough to penetrate both the photoresist layer 14 and the $Si_3N_4$ layer 12, while their penetration depth through the $Si_3N_4$ only region 13 is less than their unencumbered penetration into the regions 17 and 19 which are to become the ohmic-contact regions.

Figure 1C:
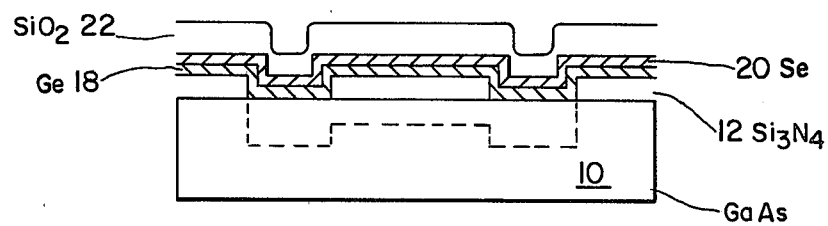
Figure 1D:
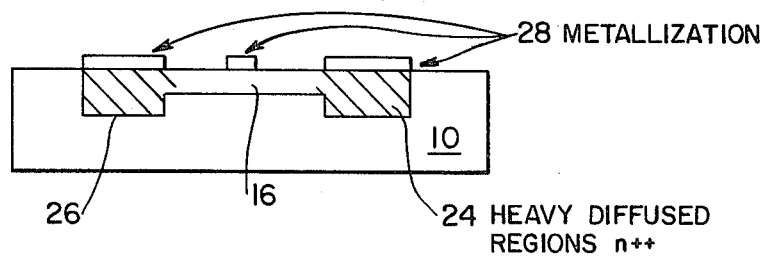

FIG. 1C shows a further deposit of a layer 18 of Ge to a depth of about 300 Å. (The above steps are part of the prior art). A layer 20 of Se is now deposited on the Ge layer 18 to a depth of about 300 Å. The device is now coated with a layer 22 of $SiO_2$, or silox, or $Si_3N_4$, or a mixture of these, and put through an annealing process at a temperature of about 750° to 850° C. for about 30 minutes. This is to rapidly diffuse the Ge and Se into the regions 24 and 26 of of the Si-ion implant which will become the ohmic contacts. Diffusion does not take place in the active channel region 16 which is protected by a $Si_3N_4$ layer 13. Lateral diffusion is limited as Si implant damage is annealed out.

The diffusion effect can be further enhanced if the Si implant is done while the III-V substrate is held at a temperature of 77° K. If this cryogenic implant is done, anneal/activation of the implant should be at a temperature of about 580° C. for about 24 hours.

The $SiO_2$, $Si_3N_4$, and excess surface Ge and Se are now removed and a layer 28 of refractory metal, preferably, is deposited over each of the regions 26, 16 and 24, which may constitute the source, gate and drain regions of the FET. This can be done in a single conventional step. Metallization over the Ge/Se diffused regions 17 and 19 results in ohmic tunneling contacts of low specific contact resistivity (e.g., $<1\times 10^{-6}$ ohm-cm$^2$) whereas metal deposited over the shallow $Si^+$ implant region 16 results in a rectifying, nonohmic, Schottky barrier contact.

Since metallization of source, gate and drain electrodes can be accomplished in one step with this approach, lithographic alignment errors are virtually eliminated. Metallization can be of the well-known Ti-W-Au type which is the most reliable known. Its reliability is not reduced by the requirement of placing a Au-Ge-Ni alloy between the Ti-W and the III-V semiconductor as is conventionally required.

The factor of importance herein is that the group IV layer (e.g., Ge) should be augmented by a group VI chalcogen layer (e.g., Se or S) such that covalent Ge-Ge bonds are broken and atomic Ge permitted to diffuse into the Si implant-damaged region. The $SiO_2$-$Si_3N_4$ encapsulant should prevent unwanted diffusion of the chalcogen or Ge into the active channel region. The Ge-chalcogen complexes formed within the silicon implant-damaged region will be physically too large to diffuse further.

The process may also be employed in III-V group materials in which acceptor atoms are implanted. Acceptor atoms of group II may be used to fill some of the Ga sites and atoms of group IV to fill some of the As sites. Thus, the first layer after the Si implant might be a layer of Zn (group II) instead of Ge and the second a layer of Ge (group IV) instead of Se. This would give a P-type of semiconductor material after anneal, which would be effected at roughly the same temperature and time conditions.

In more general terms, any impurity ions which act as donors or acceptors (i.e., elements which can be ionized to provide charge carriers) for a III–V semiconductor compound can be implanted in the substrate. These ions can come from elements in groups II, IV or VI. Although indiffusion elements have been selected and although the indiffusion elements which have been illustrated herein have been Ge and Se, they may be any pair of elements which, when diffused into the implanted region of the semiconductor, become substitutional on opposite sub-lattice sites (i.e., on the III and V element lattice sites) and act together as either a pair of donors or a pair of acceptors.

The advantages of the above-described method are:

1. It provides a breakup of the Ge-Ge complexes on the GaAs surface and thus permits a more rapid diffusion of Ge into the Si implant-damaged region such that this entire region is filled with Ge prior to damage anneal.

2. It provides for a double-sided donor activity (e.g., Ge on Ga site, chalcogen on adjacent As site).

3. It provides for a greater concentration of donors within the Si implant-damaged region.

4. Rapid impurity diffusion is limited to the Si implant-damaged region.

5. The probability of degenerate donor doping to the level required for a tunnelling contact to any metal is greatly enhanced.

6. The use of the potentially unreliable gold alloy contact is eliminated.

7. The probability of obtaining tunnelling contact action by ultra-reliable refractory metal (e.g., Pt or W) contacts is enhanced.

Obviously, many modifications and variations of the present invention are possible in light of the above teachings. It is therefore to be understood that, within the scope of the appended claims, the invention may be practiced otherwise than as specifically described.

What is claimed is:

1. A process for fabricating superior ohmic contacts in group III–V compound semiconductor materials comprising the steps of:
   selecting a substrate wafer composed of a III–V compound, III and V designating groups of elements in the periodic table of elements;
   implanting the substrate material through one surface with impurity ions from an element from groups II, IV or VI of the periodic table, the element being ionizable to provide charge carriers in the substrate, the impurity element being implanted at a fluence level or under temperature conditions which damage the lattice sites of the substrate material;
   coating said one surface with a pair of elements which, when diffused into the substrate material, provide ions which become substitutional on opposite sub-lattice sites and act together to provide charge carriers of the same polarity, either donors or acceptors;
   diffusing said pair of elements into a selected portion of the ion-implanted region;
   forming an electrode on said surface of said wafer over said selected portion of the ion-implanted region.

2. A process as in claim 1, wherein:
the step of coating comprises first coating said one surface with one element and then coating the other element over the first-element coating.

3. A process as in claim 2, wherein:
said substrate material is GaAs.

4. A process as in claim 3, wherein:
said impurity ions are Si ions.

5. A process as in claim 4, wherein:
said impurity ions are from an element selected from group IV.

6. A process as in claim 5, wherein:
said pair of elements are selected one from group IV and one from group VI.

7. A process as in claim 4, wherein:
said impurity ions are from an element selected from group VI.

8. A process as in claim 4, wherein:
said impurity ions are from an element selected from group II.

9. A process as in claim 8, wherein:
said pair of elements are selected one from group II and one from group IV.

10. A process as in claim 4, wherein:
said pair of elements for coating said one surface are Ge and Se.

11. A process as in claim 10, wherein:
the step of diffusion comprises annealing the coated wafer at a temperature of about 850° C., for a period of about 30 minutes.

12. A process as in claim 11, wherein:
the electrode material is selected from one or more refractory metals.

13. A process as in claim 12, wherein:
the electrode material is selected from one or more refractory metals.

14. A process as in claim 4, wherein:
said impurity ions are Si ions, and said coating elements are Ge and Se.

15. A process as in claim 14, wherein:
the electrode material is selected from one or more refractory metals.

* * * * *